United States Patent [19]

Sato et al.

[11] Patent Number: 4,835,550

[45] Date of Patent: May 30, 1989

[54] THICK FILM TYPE THERMAL HEAD

[75] Inventors: Kazutaka Sato, Kashiwa; Michihiro Watanabe, Tsuchiura; Munetoshi Zen, Kashiwa; Shigeru Obata, Ibaraki; Kazuhiko Atoh, Mito; Katsuhiko Kamachi, Katsuta, all of Japan

[73] Assignee: Hitachi, Ltd., Tokyo, Japan

[21] Appl. No.: 155,870

[22] Filed: Feb. 16, 1988

[30] Foreign Application Priority Data

Mar. 6, 1987 [JP] Japan ................... 62-50043

[51] Int. Cl.⁴ .......................... H05B 3/26; B41J 3/20; G01D 15/10
[52] U.S. Cl. .................. 346/76 PH; 219/216
[58] Field of Search ............... 219/216 PH, 543; 346/76 PH; 400/120

[56] References Cited

U.S. PATENT DOCUMENTS

| 3,984,844 | 10/1976 | Tanno | 219/216 PH |
| 4,203,025 | 5/1980 | Nakatani | 346/76 PH |
| 4,587,400 | 5/1986 | Kanamori | 346/76 PH |

FOREIGN PATENT DOCUMENTS

| 60-109862 | 6/1985 | Japan . |
| 60-219073 | 11/1985 | Japan . |
| 61-32152 | 7/1986 | Japan . |

Primary Examiner—Teresa J. Walberg
Attorney, Agent, or Firm—Antonelli, Terry & Wands

[57] ABSTRACT

A thick film type thermal printing head is characterized by having as a protective film a surface layer of at least one amorphous glass layer and an underlying layer of at least one crystallized glass layer or inorganic material-filled amorphous glass layer to increase reliability and life of the printing head.

7 Claims, 6 Drawing Sheets

THICK FILM TYPE THERMAL HEAD

BACGROUND OF THE INVENTION

This invention relates to a thick film type thermal printing head, more particularly to a thick film type thermal head suitable for full color printers employing a thermal transfer recording method.

Heretofore, as a thick film type thermal head, there has been used one having a structure as shown in FIG. 4 which is a cross-sectional view of the thermal head comprising an alumina substrate 1, formed thereon a thermal resistance layer 2 made of glaze glass, formed thereon electrodes 3 and a heating resistor 4, and formed thereon a protective film 7. The heating resistor 4 produces heat by Joule's heat by applying a voltage to both ends of the electrodes 3. The resulting heat energy is supplied to a medium such as a heat-sensitive sheet, a transfer sheet, etc., via the protective film 7 to carry out color development or transfer of ink.

As the protective film 7 of the thick film type thermal head, there has been used amorphous glass containing silicon oxide ($SiO_2$) and lead oxide (PbO) as major components (Japanese patent unexamined publication No. 60-219073).

The amorphous glass used as the protective film is excellent in surface smoothness, but is easily subjected to wear due to its softness when a medium slides on a head surface, that is, on the protective film. Further, the protective film as easily suffered from cracks by the medium used or thermal strain, or from scratches caused by foreign particles involved therein due to static electricity at the transport of the medium. When the protective film is scratched, resistance values of the heating resistor change only at such portions, which results in making the thermal head bad and damaging reliability of the thermal head. For example, when a heat-sensitive sheet is run in a length of 500 m using a thermal head having an amorphous glass single layer as the protective film, the thermal head surface is deteriorated as shown in FIG. 5, wherein injured portions 8 are peeled off. In FIG. 5, numeral 3 denotes an electrode, numeral 4 a heating resistor layer and numeral 7 a protective film. Further, in the injured portions like peeled off portions 8 in the protective film 7, the resistance value of the heating resistor 4 changes in 5% or more compared with the initial value, which results in making it impossible to use the thermal head for full color printers which require high precision in the resistance value.

In order to improve the strength of amorphous glass protective film, Japanese patent unexamined publication No. 60-109862 proposes a thermal head wherein a protective film comprising a first layer of thin glass, a second layer having high hardness and made of amorphous silicon carbide, boron nitride, or the like, and a third layer of thin glass (a three-layer structure). But such a three-layer structure makes the production process complicated. Further, there is another problem in that the adhesive strength between the glass and the high hardness material is weak, so that these layers are often peeled off due to a large difference in their thermal expansion coefficients. Therefore, such a thermal head cannot be used for products which require high reliability.

On the other hand, Japanese patent examined publication No. 61-32152 proposes a thermal head wherein a protective film is made of borosilicate-lead amorphous glass containing at least one metal oxide selected from $Al_2O_3$ and BeO in an amount of 15 to 30% by weight. When the amorphous glass is filled with a filler such as $Al_2O_3$, wear resistance of the protective film is improved, but the surface smoothness is lowered, and transport abnormality and a so-called stick slip phenomenon take place.

SUMMARY OF THE INVENTION

It is an object of this invention to provide a thin film type thermal head having improved surface smoothness and a longer life.

This invention provides a thick film type thermal head comprising an insulating substrate, a thermal resistance layer formed thereon, electrodes and a heating resistor layer formed on the thermal resistance layer, and a protective film formed on the heating resistor layer, said protective film comprising at least one amorphous glass layer as a surface layer and at least one crystallized glass layer or an inorganic material-filled amorphous glass layer as an underlying layer.

DESCRIPTION OF THE PREFERRED EMBODIMENTS

Figure 1:
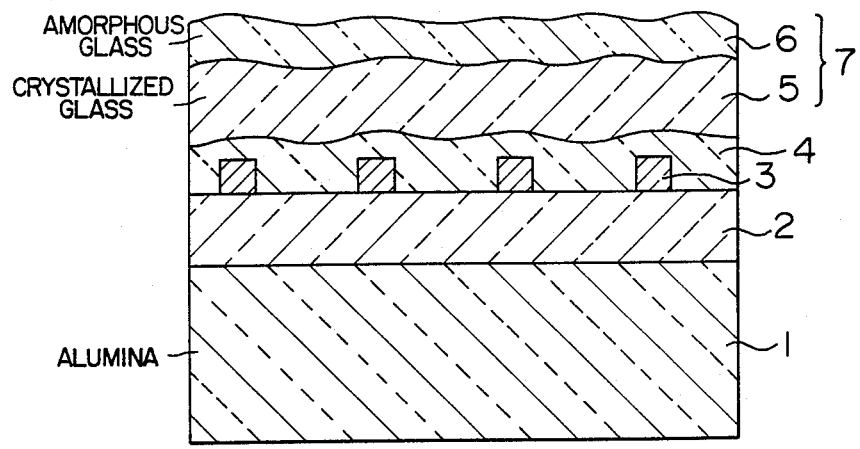
FIGS. 1 and 8 are cross-sectional views of thick film type thermal heads shown in Examples according to this invention.

The thick film type thermal head of this invention comprises an insulating substrate, a thermal resistance layer formed thereon, electrodes and a heating resistor layer formed on the thermal resistance layer, and a protective film formed on the heating resistor layer, said protective film being characterized by comprising at least one amorphous glass layer as a surface layer and at least one crystallized glass layer or an inorganic material-filled amorphous glass layer as an underlying layer.

As the insulating substrate, there can be used that made of alumina, etc., e.g. in about 1 mm thickness.

As the thermal resistance layer, there can be used that made of crystalline glaze glass or amorphous glaze glass, e.g. in about 50 μm thickness.

As the electrode, there can be used that made of gold, obtained by using a paste of gold and calcining at a temperature of 800° to 900° C., followed by etching for making a pattern.

As the heating resistor layer, there can be used that made of ruthenium oxide ($RuO_2$) (e.g. 10 μm thick), lanthanum boride ($La_2B_6$), etc., obtained by using a paste thereof and calcining at a temperature of 800° to 870° C.

The protective film formed on the heating resistor layer comprises at least one amorphous glass layer as a surface layer and at least one crystallized glass layer (e.g. 10 μm thick) or an inorganic material-filled amorphous glass layer as an underlying layer.

As the amorphous glass, there can be used that commercially available containing $SiO_2 \cdot PbO$ mainly.

The surface layer can be formed by using one kind of amorphous glass, or by using two kinds of amorphous glass having different softening points, e.g. forming a layer of amorphous glass having a softening point of 490° C. and having no voids therein, and forming thereon another one having a softening point of 500° C. strong in wear resistance. The calcining temperature of glass is usually 600° to 830° C.

The underlying layer can be formed by using crystallized glass such as G181 (a trade name, mfd. by Asahi Glass Co., Ltd.), etc., in about 10 μm thickness.

Alternatively, the underlying layer can be formed by using an inorganic material-filled amorphous glass. As the inorganic material as a filler, there can be used $Al_2O_3$, $BeO$, $ZrO_2$, $CrO$, $MgO$, etc. Such a filler can be contained in an amount of preferably about 10 to about 30% by weight. If the amount of the filler is too small, the desirable strength of the protective film cannot be obtained. On the other hand, if the amount of the filler is too large, the surface of the protective film undesirably becomes too rough. It is particularly preferable to make the surface roughness of the protective film 0.2 μm or less.

The inorganic material-filled amorphous glass is commercially available as LS201 (a trade name, mfd. by Tanaka Matthey Co.), AP series (mfd. by Asahi Glass Co., Ltd.), etc.

The inorganic material-filled amorphous glass layer (e.g. in about 10 μm thickness) can be formed by calcining at a temperature of 600° to 830° C.

It is possible to use a crystallized glass layer and an inorganic material-filled amorphous glass layer together by laminating them.

According to this invention, since the surface layer of the protective film is made of amorphous glass, it is excellent in surface smoothness, which results in making the transport of a medium such as a transfer sheet smooth. Further, since the underlying layer of the protective film is made of crystallized glass or inorganic material-filled amorphous glass, which is excellent in wear resistance, even if the surface layer is suffered from wear, cracks, scratches, etc., the underlying layer can prevent the heating resistor layer from the influence of such defects.

Further, since all the materials for forming the surface layer and the underlying layer of the protective film contain $SiO_2$ as a major component, the adhesive strength between the surface layer and the underlying layer, and between the underlying layer and the heating resistor layer, is sufficiently strong. Further, since difference in thermal expansion coefficients of individual layers is small, there is no problem in the reliability.

This invention is illustrated by way of the following Examples.

EXAMPLE 1

A thick film type thermal head having a structure as shown in FIG. 1 was produced. On an alumina substrate 1 of about 1 mm thick, a thermal resistance layer 2 made of glaze glass in 50 μm thickness was formed by calcining at 1200° C., and gold electrodes 3 of about 3 μm thick by calcining at 900° C., and a heating resistor layer 4 made of $RuO_2$ (10 μm thick) were formed thereon by calcining at 875° C. On the heating resistor layer 4, a crystallized glass layer 5 containing $SiO_2$ and $ZnO$ as major components was formed in about 10 μm thickness by calcining at 600° C. and an amorphous glass layer 6 was formed thereon in about 10 μm thickness by calcining at 600° C.

Figure 6:
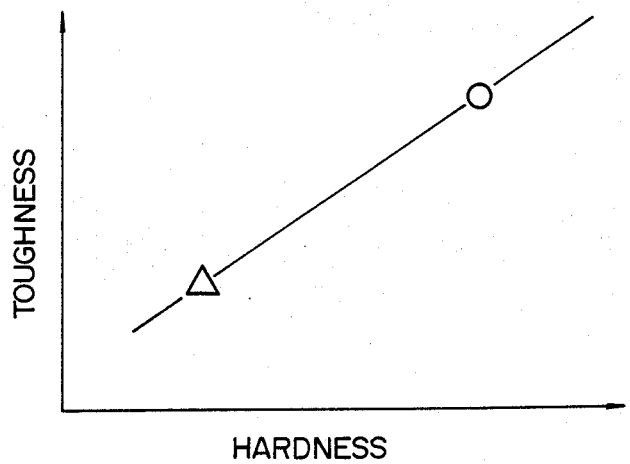
FIG. 6 is a graph showing a relationship between toughness and hardness.

Toughness and hardness of the amorphous glass containing no filler (Δ) and the crystallized glass (o) are shown in FIG. 6. As is clear from FIG. 6, the crystallized glass layer is higher in the hardness and toughness compared with the amorphous glass surface layer. Further, the crystallized glass layer is excellent in wear resistance.

Figure 3:
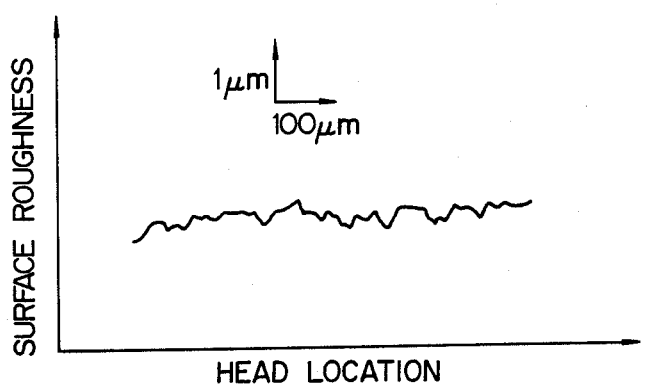
FIG. 3 is a graph showing surface roughness of the protective film shown in FIG. 1.
Figure 5:
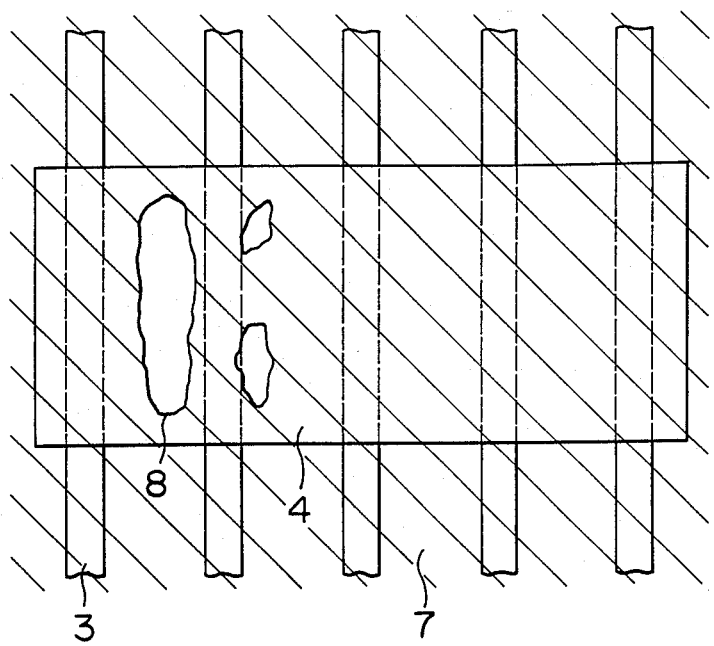
FIG. 5 is a plan view showing a surface state of the thermal head of FIG. 4 after the running test.

The surface roughness of the protective film comprising the amorphous glass layer and the crystallized glass layer is shown in FIG. 3. As is clear from FIG. 3, the surface roughness is 0.2 μm or less, which value is not different from that of a single protective film made of amorphous glass containing no filler.

According to this Example, since the surface amorphous glass layer has excellent surface smoothness, the wear coefficient at the time of transporting a medium such as a transfer sheet is small, which results in causing no trouble in the medium transport to carry out the transport smoothly.

Further, since the crystallized glass layer 5 is excellent in wear resistance and can stop damages such as wear, cracks or peeling produced in the surface amorphous glass layer 6, it can prevent the heating resistor layer 4 from the influence of the abovementioned damages, which results in maintaining the resistance value unchanged. As a result, reliability of the thermal head is remarkably improved.

Figure 7:
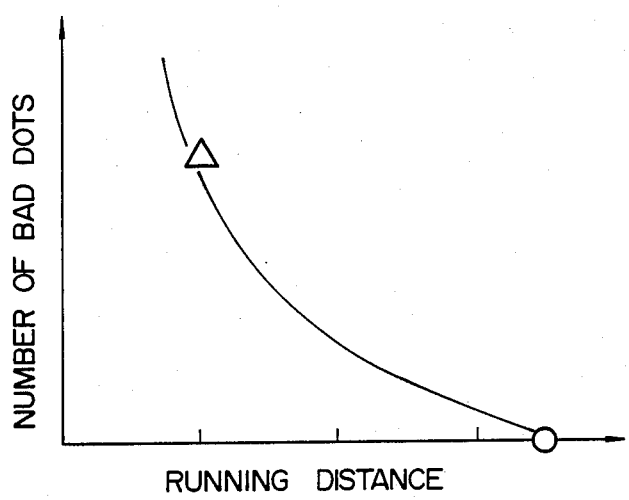
FIG. 7 is a graph showing a relationship between the number of bad dots and the running distance.

FIG. 7 shows a result of running test by taking the number of bad dots along the ordinate axis and the running distance along the abscissa axis. As is clear from FIG. 7, the thermal head of this Example (o) is by far excellent in reliability compared with a prior art thermal head (Δ) using amorphous glass alone as the protective film. That is, a large number of bad dots with changed resistance values are produced before a sufficient running distance in the case of the prior art thermal head, whereas a sufficient running distance can be satisfied without producing bad dots in the case of the thermal head of this Example, which results in remarkably improving the reliability.

COMPARATIVE EXAMPLE 1

A thick film type thermal head was produced in the same manner as described in Example 1 except for not forming the surface amorphous glass layer 6.

Figure 2:
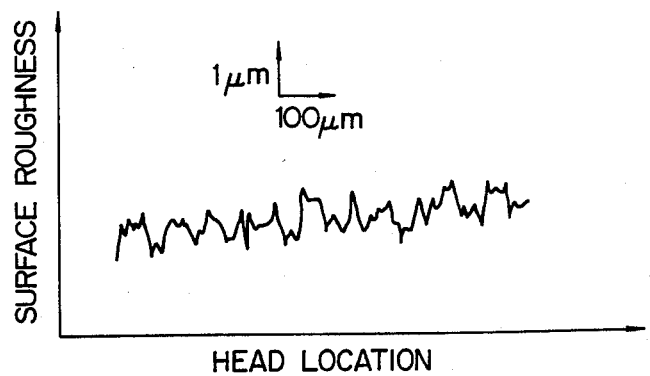
FIG. 2 is a graph showing surface roughness of a protective film made of crystallized glass.

The surface roughness of the crystallized glass layer 5 was measured and shown in FIG. 2. As is clear from FIG. 2, the surface roughness is about 1 μm, which value is too large to maintain the surface smoothness. When transport of a medium is carried out on such a surface state, for example, thermal transfer recording is carried out, there takes place a phenomenon of abnormal transport such as stopping of transport of a transfer sheet without sliding on the surface of thermal head due to a large friction coefficient between the head surface and the medium such as a heat-sensitive sheet, ink paper, etc. Further, by the same reason as mentioned above, there takes place a phenomenon of a so-called "stick slip" wherein a transfer sheet is transported while slightly sliding on the head surface. In this case, traces of sliding appear on a printed sample as stripe pattern, which results in remarkably lowering the print quality.

EXAMPLE 2

Figure 8:
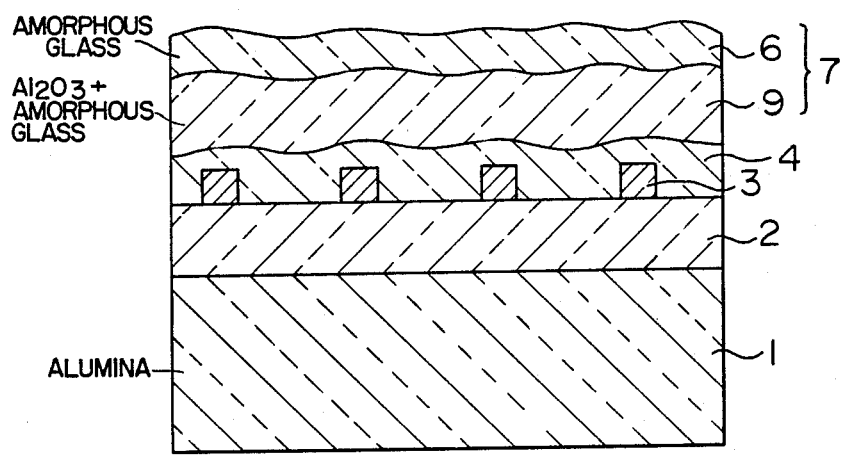

A thick film type thermal head having a structure as shown in FIG. 8 was produced in the same manner as described in Example 1 except for using a $Al_2O_3$ filler (30% by weight)—containing amorphous glass layer 9 in place of the crystallized glass layer 5.

Figure 4:
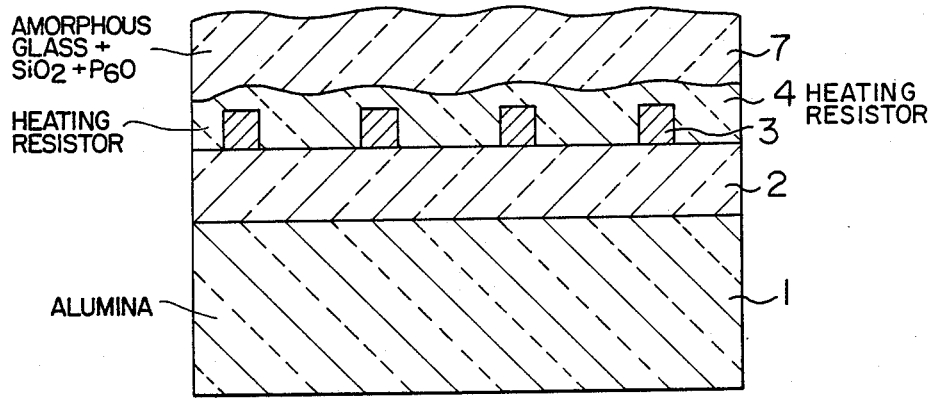
FIG. 4 is a cross-sectional view of a prior art thick film type thermal head.
Figure 9:
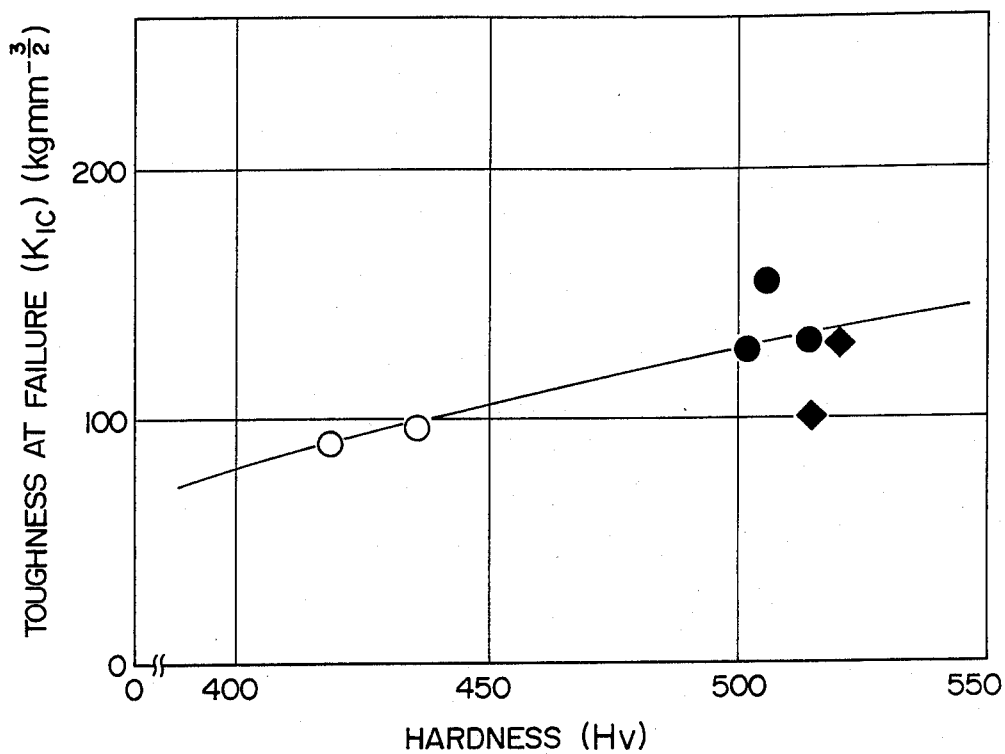
FIG. 9 is a graph showing a relationship between the toughness and the hardness.

In this Example, the surface smoothness of the surface layer is as good as 0.2 μm or less. The resistance to wear of the underlying layer 9 in terms of toughness ($K_{1c}$) is in the range of 100 to 200 kg.mm$^{-3/2}$. Further, the Vickers hardness ($H_v$) is in the range of 500 to 550. These results are shown in FIG. 9, which is a graph showing a relationship between the toughness ($K_{1c}$) and the hardness ($H_v$) of glass layers. In FIG. 9, the mark O means the protective film 7 made of amorphous glass alone as shown in FIG. 4, and the marks and mean the protective film 9 shown in FIG. 8.

Figure 10:
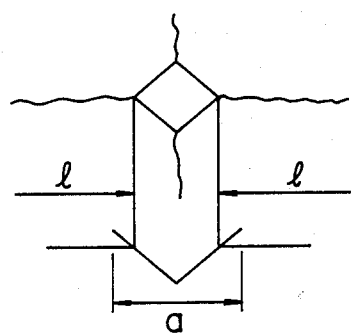
FIG. 10 is a schematic view of Vickers trace.
Figure 11:
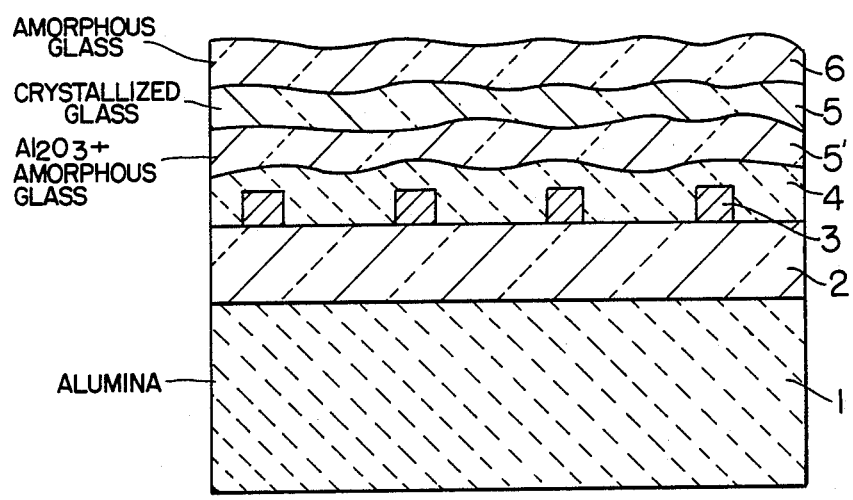

The toughness is obtained by the following equations:

$$\frac{Ec}{Ep} = \frac{Ep + Em + (Em - Ep)(1 - Vp)^{1/3}}{Ep + (Em - Ep)(1 - Vp)^{2/3}[1 - (1 - Vp)^{1/3}]}$$

$$(K_{1c}/Ha^{1/2})(H/Ec)^{2/5} = 0.018 (l/a)^{-1/2}$$

wherein
$K_{1c}$: toughness
H: Vickers hardness
a: ½ of Vickers trace in thickness*
l: average value of cracks*
*: difinitions are shown in FIG. 10
Ec: Young's modulus of amorphous glass containing $Al_2O_3$ filler
Ep: Young's modulus of amorphous glass alone
Em: Young's modulus of $Al_2O_3$
Vp: Content of $Al_2O_3$ (% by weight)

As mentioned above, according to this invention, since the surface layer of the protective film of thermal head is excellent in smoothness, the transport of a medium such as a heat-sensitive sheet can be carried out smoothy. At the same time, since the underlying layer is interposed between the surface layer and the heating resistor layer, damages on the surface layer are prevented by the underlying layer without influencing the heating resistor layer. Therefore, the thermal head is improved remarkably in the reliability and the life.

What is claimed is:

1. A thick film type thermal head comprising an insulating substrate, a thermal resistance layer formed thereon, electrodes and a heating resistor layer formed on the thermal resistance layer, and a protective film formed on the heating resistor layer, said protective film comprising at least one amorphous glass layer as a surface layer and at least one crystallized glass layer or an inorganic material-filled amorphous glass layer as an underlying layer.

2. A thermal head according to claim 1, wherein the underlying layer comprises a crystallized glass layer.

3. A thermal head according to claim 1, wherein the underlying layer comprises an inorganic material-filled amorphous glass layer.

4. A thermal head according to claim 3, wherein the inorganic material is $Al_2O_3$ or BeO.

5. A thermal head according to claim 4, wherein the amount of the inorganic material is 10 to 30% by weight.

6. A thermal head according to claim 1, wherein the surface layer comprises two amorphous glass layers having different softening points.

7. A thermal head according to claim 1, wherein the underlying layer comprises laminated layers of a crystallized glass layer and an inorganic material-filled amorphous glass layer.

* * * * *